United States Patent
Wang

(10) Patent No.: US 11,182,106 B2
(45) Date of Patent: Nov. 23, 2021

(54) REFRESH CIRCUIT FOR USE WITH INTEGRATED CIRCUITS

(71) Applicant: Arm Limited, Cambridge (GB)

(72) Inventor: Wei Wang, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/927,478

(22) Filed: Mar. 21, 2018

(65) Prior Publication Data
US 2019/0294364 A1    Sep. 26, 2019

(51) Int. Cl.
| | |
|---|---|
| G06F 12/0891 | (2016.01) |
| G11C 11/406 | (2006.01) |
| G06F 3/06 | (2006.01) |
| G11C 11/4096 | (2006.01) |
| G11C 11/408 | (2006.01) |
| G06F 13/16 | (2006.01) |

(52) U.S. Cl.
CPC .......... *G06F 3/0659* (2013.01); *G06F 3/0625* (2013.01); *G06F 3/0673* (2013.01); *G06F 12/0891* (2013.01); *G06F 13/1636* (2013.01); *G11C 11/408* (2013.01); *G11C 11/4096* (2013.01); *G11C 11/40611* (2013.01); *G11C 11/40622* (2013.01); *G06F 2212/1028* (2013.01); *G06F 2212/1041* (2013.01); *G06F 2212/22* (2013.01); *G06F 2212/608* (2013.01)

(58) Field of Classification Search
CPC . G06F 12/0802–10897; G06F 13/1636; G11C 11/40622
USPC ......................................................... 711/106
See application file for complete search history.

(56) References Cited

U.S. PATENT DOCUMENTS

| | | | | |
|---|---|---|---|---|
| 5,469,559 | A | * | 11/1995 | Parks ...................... G06F 12/06 711/106 |
| 5,530,932 | A | * | 6/1996 | Carmean ............... G06F 1/3203 713/324 |
| 6,389,505 | B1 | * | 5/2002 | Emma .................. G06F 12/0802 365/222 |
| 2003/0005226 | A1 | * | 1/2003 | Hong .................. G06F 12/0846 711/119 |

(Continued)

OTHER PUBLICATIONS

Agarwall et al. "Refrint: Intelligent Refresh to Minimize Power in On-Chip Multiprocessor Cache Hierarchies." Feb. 2013. IEEE. HPCA2013. (Year: 2013).*

(Continued)

*Primary Examiner* — Nathan Sadler
(74) *Attorney, Agent, or Firm* — Pramudji Law Group PLLC; Ari Pramudji

(57) ABSTRACT

Various implementations described herein are directed to an integrated circuit having a cache with memory components that store data with multiple addresses. The integrated circuit may include a controller that communicates with the cache to provide directives to the cache. The integrated circuit may include a refresh circuit that interprets the directives received from the controller to generate interpretation information based on determining one or more particular addresses of the multiple addresses that no longer need refreshing. The refresh circuit may further employ the interpretation information to skip the need for refreshing the one or more particular addresses pointing to the memory components in the cache that no longer need refreshing.

19 Claims, 7 Drawing Sheets

(56) References Cited

U.S. PATENT DOCUMENTS

| | | | | |
|---|---|---|---|---|
| 2009/0144492 | A1* | 6/2009 | Barth | G06F 12/0893 |
| | | | | 711/106 |
| 2014/0032829 | A1* | 1/2014 | Solihin | G11C 7/1072 |
| | | | | 711/105 |
| 2016/0048451 | A1* | 2/2016 | Solihin | G06F 12/0833 |
| | | | | 711/105 |
| 2017/0301386 | A1* | 10/2017 | Parks | G06F 3/0619 |
| 2018/0365154 | A1* | 12/2018 | Ranjan | G06F 12/0848 |
| 2019/0013062 | A1* | 1/2019 | Atallah | G11C 11/40607 |

OTHER PUBLICATIONS

Jakšić et al. "DRAM-based Coherent Caches and How to Take Advantage of the Coherence Protocol to Reduce the Refresh Energy." Mar. 2014. IEEE. Date 2014. (Year: 2014).*

William Stallings. Computer Organization and Architecture: Designing for Performance. 2010. Prentice Hall. 8th ed. pp. 640-645.*

IEEE. IEEE 100: The Authoritative Dictionary of IEEE Standards Terms. Dec. 2000. IEEE. 7th ed. pp. 966.*

Boroumand et al. "LazyPIM: An Efficient Cache Coherence Mechanism for Processing-in-Memory." Jun. 2017. IEEE. IEEE Computer Architecture Letters. vol. 16.*

U.S. Appl. No. 15/886,970.

Bhati, et al.; DRAM Refresh Mechanisms, Penalties, and Trade-Offs; Transactions on Computers; vol. 65, Issue 1; IEEE; Jan. 2016. DOI: 10.1109/TC.2015.2417540.

Chang, et al; Technology Comparison for Large Last-Level Caches (L3Cs): Low-Leakage SRAM, Low Write-Energy STT-RAM, and Refresh-Optimized eDRAM; 19th International Symposium on High Performance Computer Architecture (HPCA); IEEE; Feb. 2013. DOI: 10.1109/HPCA.2013.6522314.

Moshnyaga, et al.; Reducing Energy of DRAM/Flash Memory System by OS-controlled Data Refresh International Symposium on Circuits and Systems; IEEE; May 2007. DOI: 10.1109/ISCAS.2007. 378515.

Low Power Function of Mobile RAM Partial Array Self Refresh (PASR); Elpida Memory; Nov. 2005.

* cited by examiner

200

REFRESH CIRCUIT FOR USE WITH INTEGRATED CIRCUITS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, cache memory systems are typically restricted by various timing constraints. For instance, L2 and L3 cache memory is relatively slow and consumes large amounts of power when compared to L1 cache memory. Thus, these disadvantageous timing and power issues typically affect data access times and often cause delay problems when data access is requested by a processor. Hence, there exists a need to improve L2 and L3 cache memory designs.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to system memory cache that conserves energy by determining various instances where retaining data may be deemed unnecessary and/or skipping refresh of memory components in the cache that no longer need refreshing. Some implementations described herein are related to on-chip or off-chip dynamic random access memory (DRAM) cache memory arrays. For DRAM caches, such as on-chip DRAM caches (e.g., eDRAM, system cache) or off-chip DRAM caches (e.g., NVDIMM, hybrid memories), if a cache line (e.g., having a page size of 4 KB) holds invalid data, refresh operations may be skipped. NVDIMM refers to a non-volatile dual in-line memory module that is a type of random access memory. In this instance, DRAM rows that map to invalid cache lines may be skipped for refresh. Therefore, system cache memory may refer to a DRAM cache that needs less refresh instances, and in particular, the system cache memory may refer to a DRAM cache that does not refresh cache lines that are no longer valid, such as invalid cache lines.

Various implementations of system memory cache that conserves energy will now be described in detail herein with reference to FIGS. 1-7.

Figure 1:
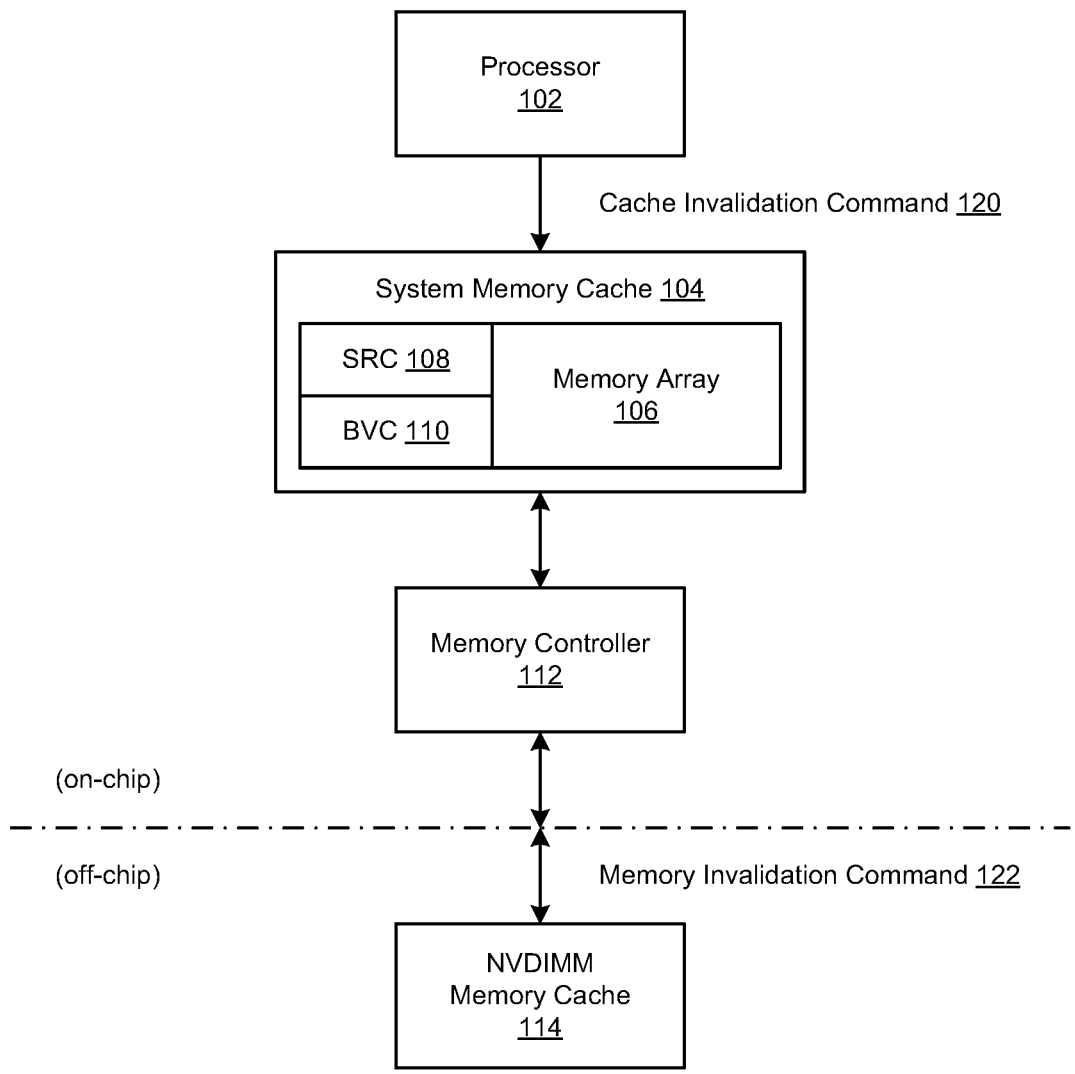
FIG. 1 illustrates a diagram of memory circuitry in accordance with various implementations described herein.

FIG. 1 illustrates a block diagram of memory circuitry 100 in accordance with various implementations described herein. In this instance, the memory circuitry 100 may include system memory cache 104 having a memory array 106.

As shown in FIG. 1, the memory circuitry 100 may include a processor 102, the system memory cache 104, a memory controller 112, and another memory cache, such as, e.g., an NVDIMM memory cache 114. These components 102, 104, 112, 114 may be coupled together to conserve energy (or power) in memory applications.

The processor 102 may be embodied as a first controller, such as, e.g., central processing unit (CPU) and/or graphics processing unit (GPU). The processor 102 (or controller) may communicate with the system memory cache 104 to provide directives to the cache 104. The directives may include commands or instructions, and the processor 102 (or controller) may communicate with the system memory cache 104 to transmit (or send) the commands or instructions to the cache 104. In some implementations, the commands or instructions may be a cache invalidation command or instruction. In other implementations, the commands or instructions may be a memory unmap command or instruction that is associated with a deallocation operation or a trim operation. Further, in some instances, the processor 102 may communicate with an on-chip cache (e.g., DRAM cache) via a command based directive, and the processor 102 may communicate with an off-chip cache (e.g., NVDIMM cache) via an instruction based directive.

The system memory cache 104 may include memory components that store data with multiple addresses. The system memory cache 104 may be referred to as a cache, and the system memory cache 104 may be implemented with dynamic random access memory (DRAM) components. Thus, the memory array 106 may be implemented as a DRAM cache array, and the memory components may be implemented with DRAM components that are arranged in a structural form to define the DRAM cache array. In some implementations, the system memory cache 104 may refer to an on-chip DRAM cache, such as, e.g., eDRAM system cache array.

The memory array 106 may include any number of bitcells arranged in various configurations, such as, e.g., a two-dimensional (2D) memory array having any number of columns and any number of rows of multiple bitcells, which may be arranged in a 2D grid pattern with 2D indexing capabilities. Each bitcell may be referred to as a memory storage cell, and each bitcell may be configured to store at least one data bit value (e.g., data value related to a logical '0' or '1').

The memory circuitry 100 may be implemented as an integrated circuit (IC) for various types of memory applications, such as, e.g., DRAM and/or any other types of volatile memory. The memory circuitry 100 may also be implemented as an IC with dual rail memory architecture and related circuitry. The memory circuitry 100 may be integrated with computing circuitry and related components on a single chip. The memory circuitry 100 may be implemented in embedded systems for electronic and mobile applications, including low power sensor nodes for IoT (Internet of things) applications.

The system memory cache 104 may include a refresh circuit 108 that may be referred to as a self refresh circuit (SRC) for various memory applications. For instance, some classes of memory, such as, e.g., DDR SDRAM refers to a double data rate synchronous dynamic random-access memory that incorporates use of a self-refresh circuit (SRC). During operation, the refresh circuit 108 may intercept directives from the processor 102 (or controller). For instance, as shown in FIG. 1, the processor 102 (or controller) may transmit (or send) a first directive, such as, e.g., a cache invalidation command 120, to the system memory cache 104, and the refresh circuit 108 may intercept the first directive (or the cache invalidation command 120) from the processor 102 (or controller).

The refresh circuit 108 may interpret the intercepted directives to generate interpretation information (or related data) based on determining one or more particular addresses of the multiple addresses that no longer need refreshing. In some scenarios, determining the one or more particular addresses that no longer need refreshing refers to determining one or more instances where retaining data is deemed unnecessary. Thus, the refresh circuit 108 may determine one or more particular addresses of the multiple addresses that reference instances where retaining data is deemed unnecessary.

The refresh circuit 108 may employ the interpretation information (or related data) to conserve energy (or power) by skipping a need for refreshing the one or more particular addresses of the multiple addresses pointing to (or that point to) the memory components in the system memory cache 104 that no longer need refreshing. In some implementations, employing the interpretation information (or related data) to conserve energy by skipping the need for refreshing the one or more particular addresses may include utilizing the interpretation information (or related data) to save power by escaping the need for refreshing the one or more particular addresses. In some instances, skipping or escaping refresh operations may refer to selectively cutting power (or supply of power) to particular addresses that no longer need to be refreshed.

The refresh circuit 108 may also monitor and/or track the directives intercepted from the processor 102 (or controller) to assist with determining the one or more particular addresses of the multiple addresses that no longer need refreshing. Thus, by monitoring and/or tracking directives intercepted from the processor 102 (or controller), the refresh circuit 108 may use the interpretation information (or related data) to conserve energy (or save power) by skipping (or escaping) the need for retaining data for the one or more particular addresses of the multiple addresses that point to the memory components (e.g., DRAM components) in the system memory cache 104 that no longer need to retain data (or, i.e., no longer need to be refreshed).

The system memory cache 104 may further include a bit vector circuit (BVC) 110 that interfaces with the refresh circuit 108 to assist with determining the one or more particular addresses of the multiple addresses that no longer need refreshing. In some scenarios, the bit vector circuit (BVC) 110 may interface with the refresh circuit 108 to assist with determining the one or more particular addresses of the multiple addresses that reference the instances where retaining data is deemed unnecessary.

The memory controller 112 may be embodied as a second controller that is different than the processor (or first controller). In some implementations, the memory controller 112 may communicate with one or more caches, such as, e.g., the system memory cache 104 and/or the NVDIMM memory cache 114. In some implementations, the memory controller 112 (or second controller) may operate in a similar manner as the processor 102 (or first controller) with respect to the NVDIMM memory cache 114. Also, the NVDIMM memory cache 114 may refer to an off-chip DRAM cache, which may include or at least involve hybrid type memories.

In some implementations, the memory controller 112 may receive a second directive, such as, e.g., a memory invalidation command 122, from the NVDIMM memory cache 114. Then, the memory controller 112 may provide the second directive (or the memory invalidation command 122) to the system memory cache 104. At this point, the refresh circuit 108 may intercept the second directive (or memory invalidation command 122) from the memory controller 112 when sent to the system memory cache 104.

Figure 2:
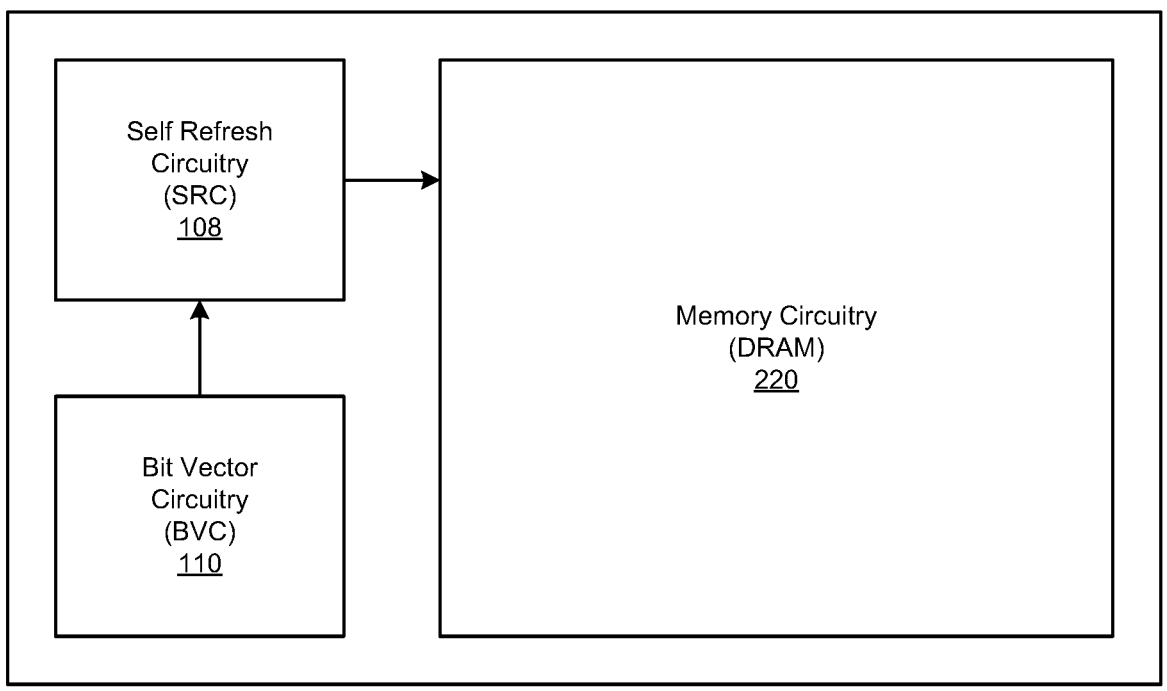
FIG. 2 illustrates a diagram of a system memory cache for conserving energy in accordance with various implementations described herein.

FIG. 2 illustrates a block diagram 200 of the system memory cache 104 for conserving energy in accordance with various implementations described herein. In this instance, the diagram 200 of FIG. 2 provides an implementation of the system memory cache 104 that is shown in FIG. 1.

As shown in FIG. 2, the system memory cache 104 may include the refresh circuit 108, which may be referred to as a self refresh circuit (SRC). The system memory cache may include the bit vector circuitry (BVC) 110 and memory circuitry 220, which may be implemented with DRAM components arranged in an array.

In some implementations, the refresh circuit (SRC) 108 may communicate with the bit vector circuitry (BVC) 110 to check a self refresh bit vector to thereby skip refresh (or cause to escape refresh) of one or more rows in the memory circuitry 220 that map to invalid cache lines. In this instances, with reference to FIG. 1, the processor 102 may inform the refresh circuit (SRC) 108 of invalid cache lines via one or more more particular directives. For instance, the processor 102 (e.g., controller, CPU, or GPU) may issue a cache invalidation command or instruction. In some scenarios, the memory controller 112 (shown in FIG. 1) may provide (or issue) the NVDIMM memory cache 114 a memory invalidation command or instruction, which may be used to unmap the invalid cache lines from being refreshed, such as in situations (or instances) where retaining data is deemed unnecessary. In some instances, unmapping an invalid cache line may refer to using an MMAP command or instruction. Further, as described herein, for DRAM caches, such as on-chip DRAM caches (e.g., eDRAM, system cache) or off-chip DRAM caches (e.g., NVDIMM, hybrid memories), if a cache line holds invalid data, then refresh operations may be skipped (or escaped). Also, in some instances, DRAM rows that map to invalid cache lines (e.g., cache lines that no longer need refresh) may be skipped.

Figure 3:
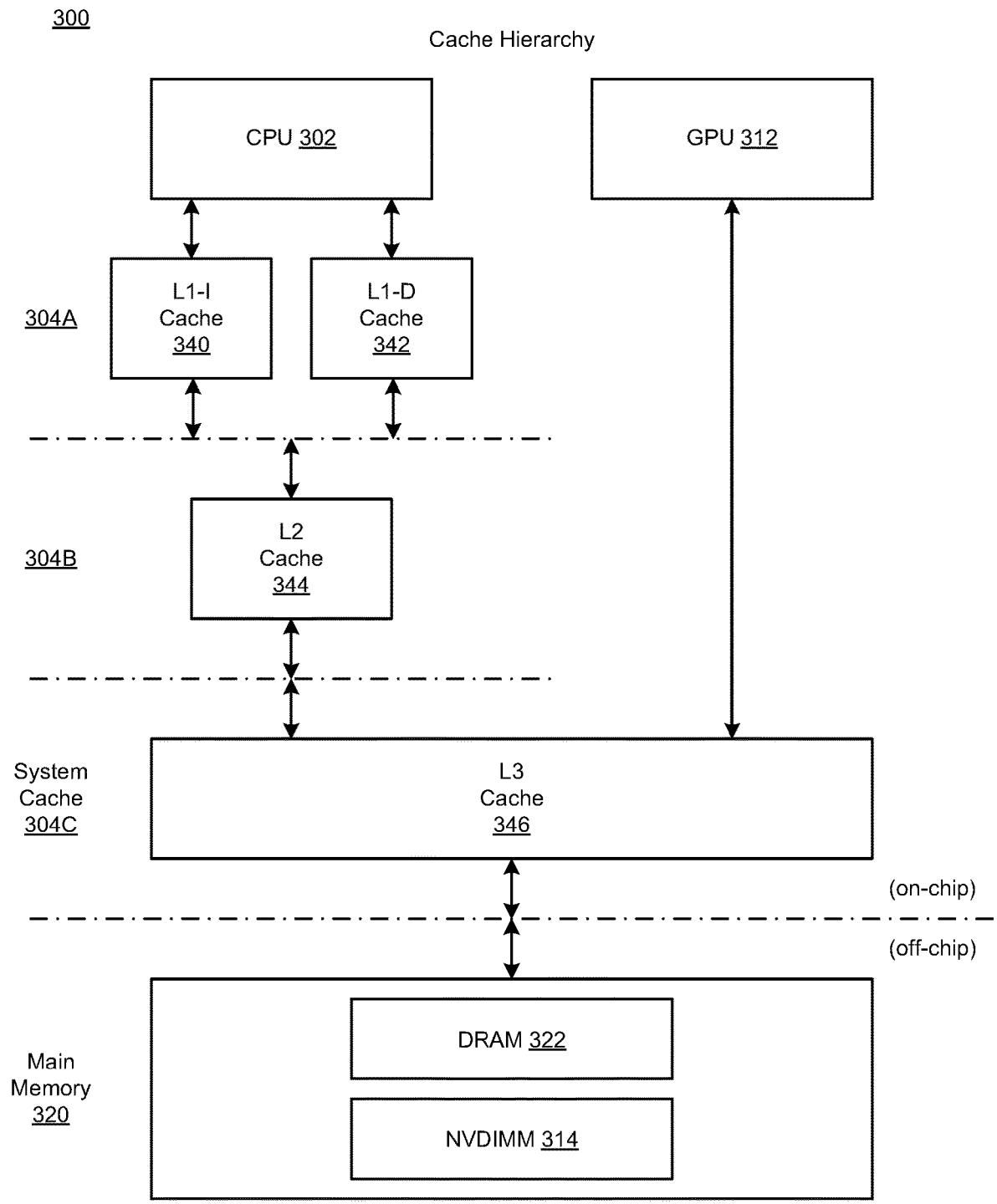
FIG. 3 illustrates a diagram of memory circuitry having multi-leveled cache in accordance with various implementations described herein.

FIG. 3 illustrates a diagram of memory circuitry 300 having multi-level cache in accordance with various implementations described herein. Along with system cache, the memory circuitry 300 may also include main memory 320.

As shown in FIG. 3, the memory circuitry 300 shows a cache hierarchy that may include multiple levels of cache L1, L2, L3 that interface with one or more processors, such as, e.g., CPU 302 and/or GPU 312. For instance, the multiple levels of cache L1, L2, L3 may include a first level of cache L1 304A, a second level of cache L2 304B, and a third level of cache L3 304C. The first level of cache L1 304A may include L1-I cache 340 (instruction related cache) and L1-D cache 342 (data related cache).

The L1 caches 340, 342 may be organized as a banked cache that may be coupled closest (or nearest) to the CPU 302 for faster access time. The L1 caches 340, 342 may be implemented with static RAM (SRAM). Further, as shown, the CPU 302 may communicate directly with the L1 caches 340, 342.

The lower level L2 cache 344 and L3 cache 346 may be accessed when there is an issue with accessing the L1 cache 340, 342, which may imply that a frequency of access to the lower level caches L2 344, L3 346 may be slower when compared to a frequency of access to the L1 cache 340, 342. The L2 cache 344 may be implemented with static RAM (SRAM). The L3 346 may be implemented with dynamic RAM (DRAM) as a DRAM cache, and the energy conversing schemes and techniques described herein are concerned with and directed towards the L3 cache 346. As such, the system cache 304C refers to the L3 cache 346, which may be implemented with DRAM components, such as, e.g., on-chip eDRAM components. As shown, the CPU 302 may communicate with the on-chip L2 cache 344 and the on-chip L3 cache 346 via the L1 cache 340, 342, and the GPU 312 may communicate directly with the on-chip L3 cache 346.

The main memory 320 may be implemented as NVDIMM, which may include a DRAM array 322 and an NVDIMM cache 314. In some implementations, the DRAM array 322 is similar to the memory circuitry 220 as described in reference to FIG. 2, and the NVDIMM cache 314 is similar to the off-chip NVDIMM memory cache 114 as described in reference to FIG. 1. Thus, the NVDIMM cache 314 may be implemented with DRAM as an off-chip DRAM cache, and energy conversing schemes and techniques described herein are concerned with and directed towards the NVDIMM cache 314.

Figure 4:
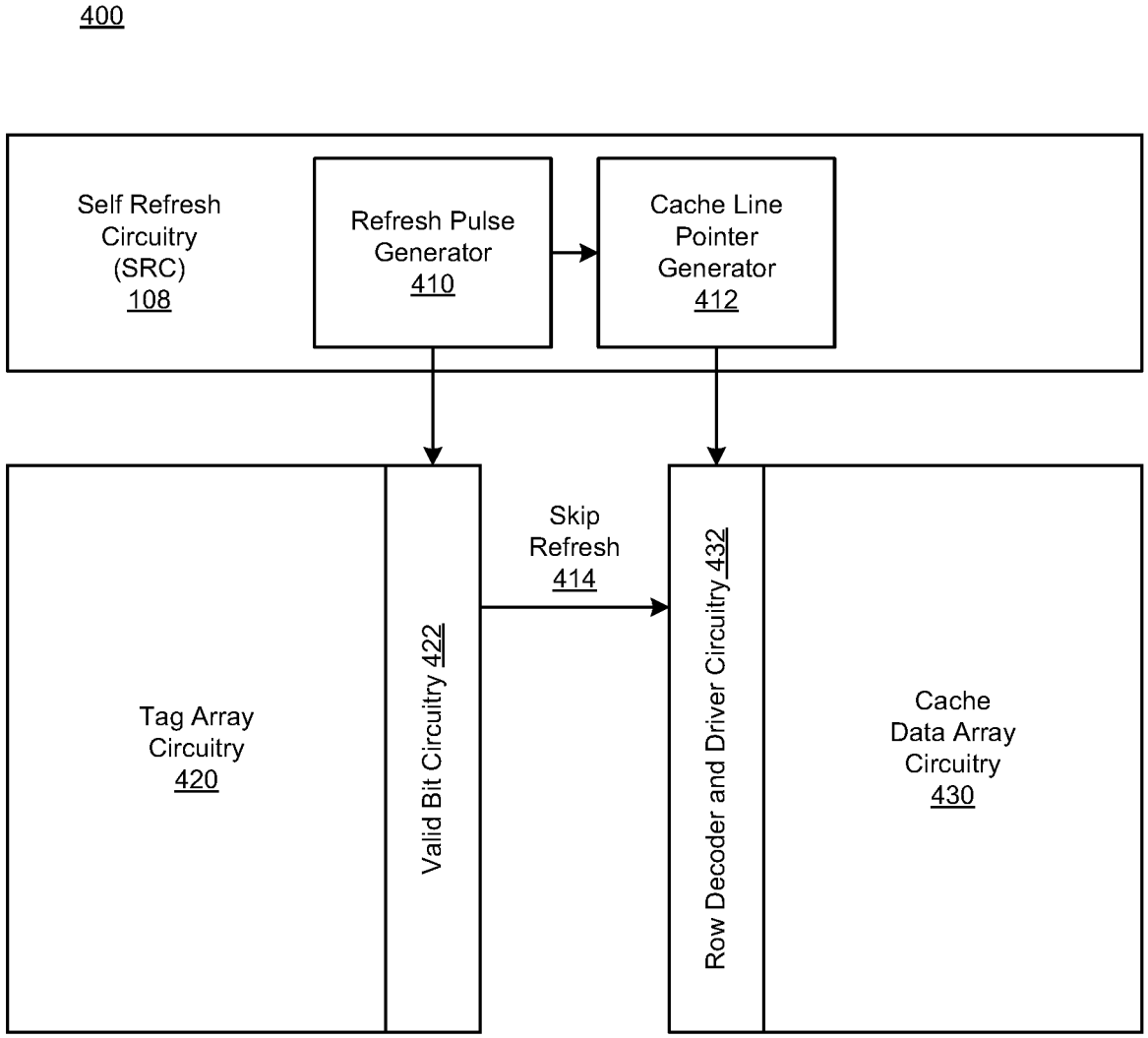
FIG. 4 illustrates a diagram of memory refresh circuitry in accordance with various implementations described herein.

FIG. 4 illustrates a block diagram 400 of refresh circuitry 108 in accordance with various implementations described herein. The diagram 400 further shows tag array circuitry 420 and cache data array circuitry 430.

As shown in FIG. 4, the refresh circuitry 108 (or self refresh circuitry) may include a refresh pulse generator 410 and a cache line pointer generator 412. The refresh pulse generator 410 may interface with the tag array circuitry 420 so as to communicate with valid bit circuitry 422. The cache line pointer generator 412 may interface with the cache data array circuitry 430 so as to communicate with row decoder and driver circuitry 432. The cache data array circuitry 430 may be similar the memory array 106 of FIG. 1 and/or the memory circuitry 220 of FIG. 2. As such, the cache data array circuitry 430 may include a DRAM cache that is implemented as a DRAM array and include DRAM components that are arranged in a structural form to define the DRAM array. As described herein, the refresh operations may be performed and/or achieved row-by-row and may skip refresh 414 (or cause to escape refresh) of one or more rows that are invalid (or considered invalid by the processor 102). In some cases, the granularity may be larger than rows, i.e., at bank level, as in PASK (partial array self refresh in t4).

Figure 5:
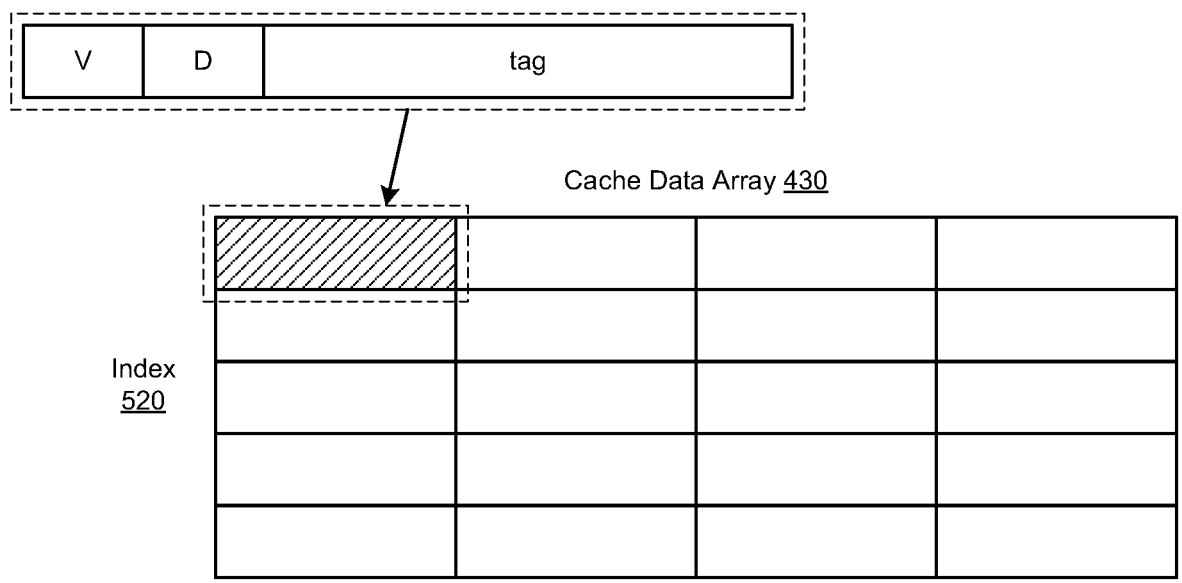
FIG. 5 illustrates a diagram of a cache data array in accordance with various implementations described herein.

FIG. 5 illustrates a block diagram 500 of the cache data array circuitry 430 (of FIG. 4) in accordance with various implementations described herein.

As shown in FIG. 5, the cache data array 430 may be arranged in columns and rows with tags per cache line 510. The cache data array 430 may include any number of tags per cache line 510 that are arranged in various configurations, such as, e.g., a two-dimensional (2D) cache array having any number of columns and any number of rows of multiple tags per cache line 510, which may be arranged in a 2D grid pattern with 2D indexing capabilities, e.g., via index 520. Each tag per cache line 510 may be referred to as an address storage cell, and as such, each tag per cache line 510 may be configured to store at least one address value (e.g., using any number of bits for indexing). Thus, each tag per cache line 510 may hold (or store) an address for address mapping with a physical address in memory, such as, e.g., main memory 320 in FIG. 3. In this instance, the cache data array 430 provides for mapping between DRAM and cache, wherein the DRAM cache is implemented with DRAM components. In various implementations, each tag per cache line 510 may include a bit vector (V), a data component (D), and a tag (tag) that holds and points to a physical address in memory.

In some implementations, the cache data array 430 may be implemented with a 4-way associative cache data array. DRAM cache tags may be used to indicate whether a cache line is valid or not. For instance, a bit vector may be provided (or generated, or built) to indicate which row maps to an invalid cache line, upon entering DRAM self-refresh mode. The self-refresh circuitry 108 may check bit vectors, and then the refresh circuitry 108 may skip invalid cache lines if the bit vector is set.

In some implementations, a processor may use software to take advantage of this bit vector feature in hardware so as to save energy (or power) by informing the DRAM cache of deallocated memory regions. As such, this bit vector feature may be used in software applications for invalidating cache lines in certain regions via cache invalidation commands (or instructions), such as, e.g., DC IVAC (on-chip DRAM cache) and memory invalidation command UNMAP, as defined in NVDIMM-P (off-chip DRAM cache).

Figure 6:
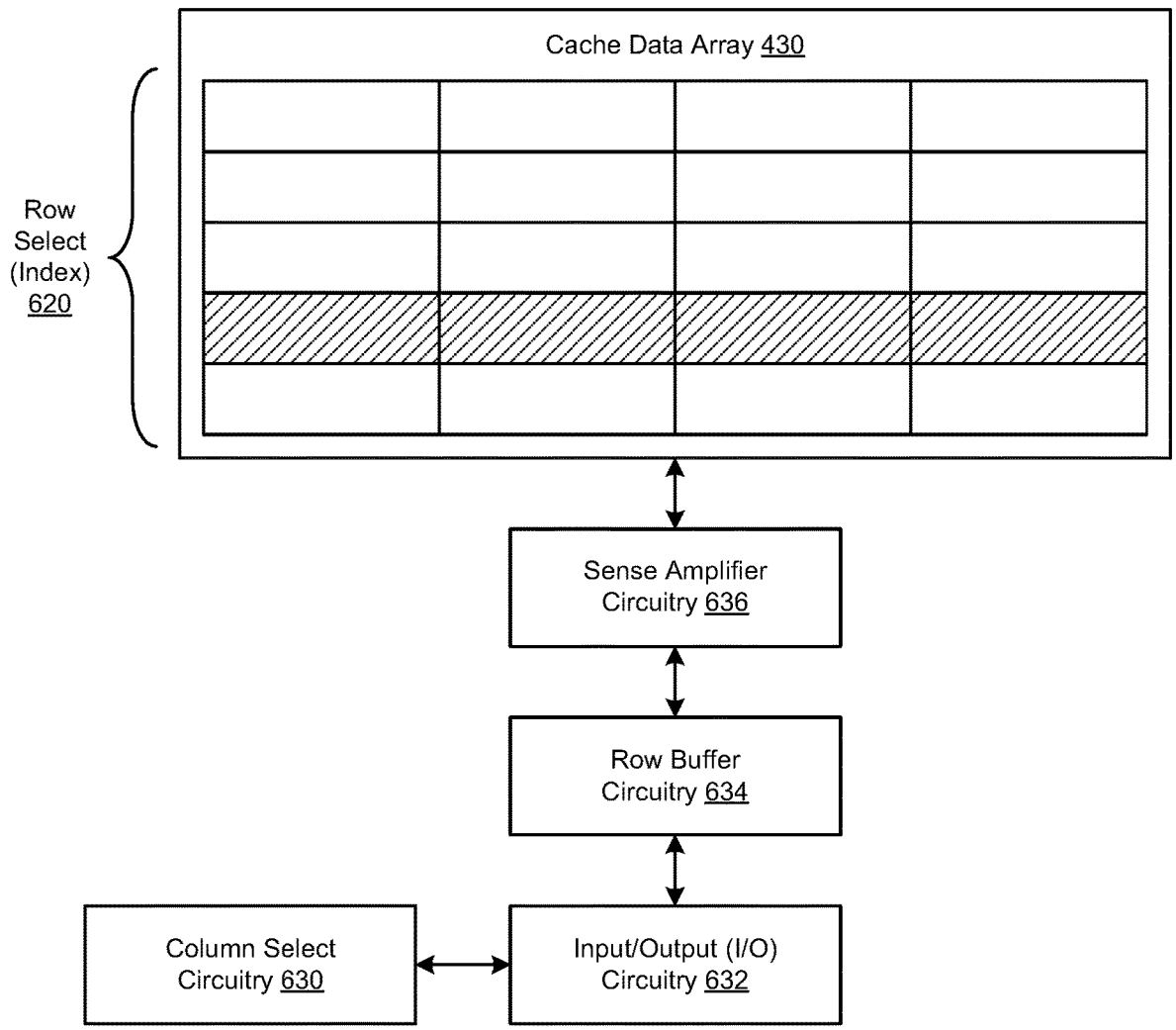
FIG. 6 illustrates a diagram of address mapping for a cache data array in accordance with various implementations described herein.

FIG. 6 illustrates a diagram 600 of address mapping 602 for the cache data array 430 (of FIG. 5) in accordance with various implementations described herein.

As shown in FIG. 6, address mapping may refer to a DRAM data block 604 having row data, column select (CS) data, rank data, bank data, and column data. The address mapping may also refer to a cache data block 606 having tag data, index data, and offset data (which indicates an offset in the cache line). As described herein, the cache data array 430 may include any number of physical addresses (or tags per cache line) that are arranged in various configurations, such as, e.g., a two-dimensional (2D) cache array having any number of columns and any number of rows of multiple physical addresses that are arranged in a 2D grid pattern with 2D indexing capabilities, e.g., via row select data or index 620. Each physical address block in the cache data array 430 may be referred to as an address storage cell, and as such, each physical address may be configured to store at least one address value (e.g., using any number of bits for indexing capabilities).

In some implementations, during operation, column select circuitry 630 may communicate with input/output (I/O) circuitry 632 to provide column select data related to invalid cache lines that no longer need refreshing. The I/O circuitry 632 may communicate with row buffer circuitry 634 to provide row select data related to invalid cache lines that no longer need refreshing. Further, the row buffer circuitry 634 may communicate with sense amplifier circuitry 636 to access one or more physical addresses stored in the cache data array 430 that no longer need refreshing. As such, the sense amplifier circuitry 636 may communicate with the cache data array 430 and use the column select data and the row select data to invalidate cache data lines that no linger need refreshing.

Figure 7:
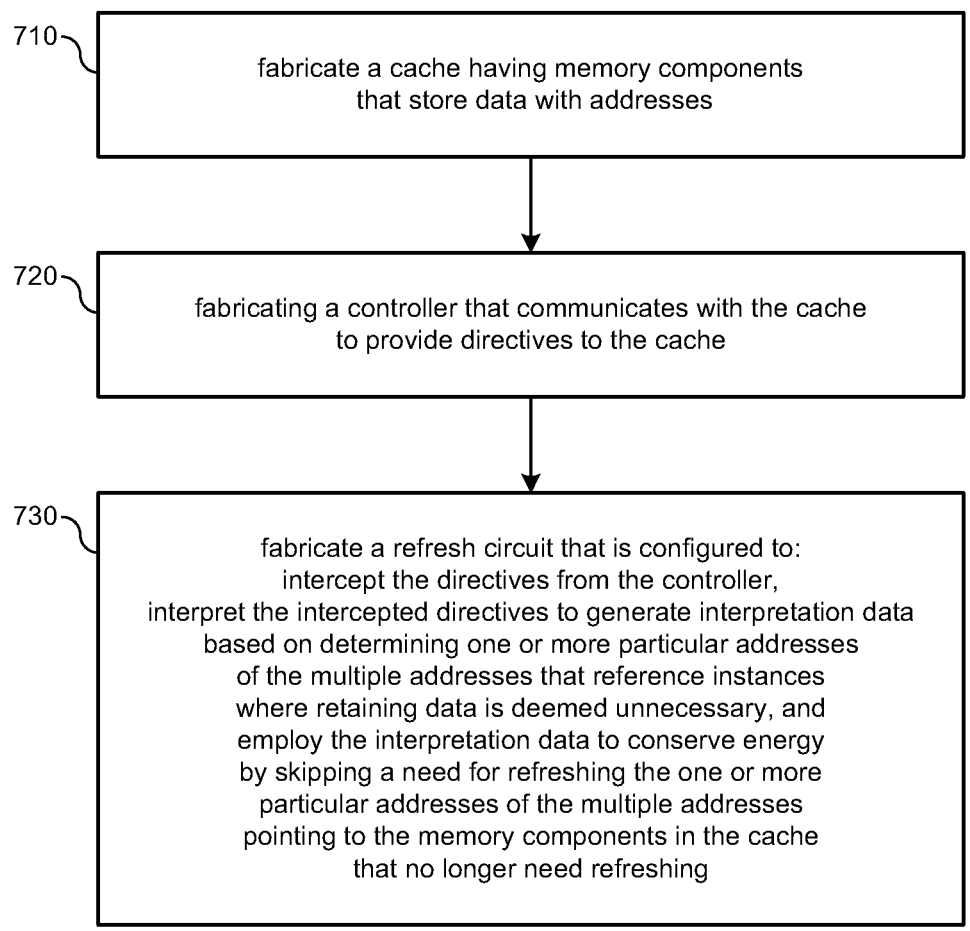
FIG. 7 illustrates a process flow diagram of a method for manufacturing an integrated circuit in accordance with various implementations described herein.

FIG. 7 illustrates a process flow diagram of a method 700 for manufacturing an integrated circuit in accordance with various implementations described herein.

It should be understood that even though method 700 may indicate a particular order of operation execution, various certain portions of operations may be executed in a different order, and on different systems. Also, additional operations and/or steps may be added to and/or omitted from method 700. Method 700 may be implemented in hardware and/or software. If implemented in hardware, method 700 may be implemented with various circuit components, such as described in reference to FIGS. 1-6. If implemented in software, method 700 may be implemented as a program or software instruction process configured for implementing energy conservation for memory applications in a manner as described herein. Further, if implemented in software, instructions related to implementing method 700 may be stored in memory and/or a database. For instance, a computer or various other types of computing devices having a processor and memory may be configured to perform method 700.

As described and shown in reference to FIG. 7, method 700 may be used for manufacturing an integrated circuit (IC) that implements energy (or power) conservation in various types of memory applications.

At block 710, method 700 may fabricate a cache having memory components that store data with addresses. The cache may be implemented as a DRAM array, and the memory components may be implemented with DRAM components that are arranged in a structural form to define the DRAM array.

At block 720, method 700 may fabricate a controller that communicates with the cache to provide directives to the cache. The directives may include commands or instructions, and the controller may communicate with the cache to transmit or send the commands or instructions to the cache. In some instances, the commands or instructions may be a cache invalidation command or instruction. In other instances, the commands or instructions may be a memory unmap command or instruction that is associated with a deallocation operation or a trim operation. The controller may be a processor, a central processing unit (CPU), a graphics processing unit (GPU), or a memory controller.

At block 730, method 700 may fabricate a refresh circuit that is configured to intercept the directives from the controller, interpret the intercepted directives, and employ interpretation data to conserve energy. The refresh circuit may interpret the intercepted directives to generate interpretation data based on determining one or more particular addresses of the multiple addresses that reference instances where retaining data is deemed unnecessary. The refresh circuit may employ the interpretation data to conserve energy by skipping a need for refreshing the one or more particular addresses of the multiple addresses pointing to the memory components in the cache that no longer need refreshing. The refresh circuit may be implemented as a self refresh circuit.

In some implementations, determining the one or more particular addresses that no longer need refreshing may refer to determining one or more instances where retaining data is deemed unnecessary. The refresh circuit may monitor and/or track the directives intercepted from the controller so as to assist with determining the one or more particular addresses of the multiple addresses that no longer need refreshing. Further, in some instances, employing the interpretation information to conserve energy by skipping the need for refreshing the one or more particular addresses may include utilizing the interpretation information to save power by escaping the need for refreshing the one or more particular addresses. The method 700 may further include fabricating a bit vector circuit that interfaces with the refresh circuit and assists with determining the one or more particular addresses of the multiple addresses that no longer need refreshing.

Described herein are various implementations of an integrated circuit having a cache with memory components that store data with multiple addresses. The integrated circuit may include a controller that communicates with the cache to provide directives to the cache. The integrated circuit may include a refresh circuit that interprets the directives received from the controller to generate interpretation information based on determining one or more particular addresses of the multiple addresses that no longer need refreshing. The refresh circuit may further employ the interpretation information to skip the need for refreshing the one or more particular addresses pointing to the memory components in the cache that no longer need refreshing.

Described herein are various implementations of an integrated circuit. The integrated circuit may include a cache with dynamic random access memory (DRAM) components that store data with multiple addresses. The integrated circuit may include a processor that communicates with the cache to send directives to the cache. The integrated circuit may include a self refresh circuit that intercepts the directives from the processor and determines one or more particular addresses of the multiple addresses that reference instances where retaining data is deemed unnecessary. The refresh circuit may interpret the intercepted directives to generate interpretation data based on determining the one or more particular addresses of the multiple addresses that reference the instances where retaining data is deemed unnecessary. The refresh circuit may use the interpretation data to save power by escaping a need for retaining data for the one or more particular addresses of the multiple addresses that point to the DRAM components in the cache that no longer need to retain data.

Described herein are various implementations of a method for manufacturing or fabricating an integrated circuit. The method may include fabricating a cache having memory components that store data with addresses. The method may include fabricating a controller that communicates with the cache to provide directives to the cache. The method may further include fabricating a refresh circuit that is configured to interpret the directives received from the controller to generate interpretation data (or interpretation information) based on determining one or more particular addresses of the addresses that reference instances where retaining data is deemed unnecessary. The refresh circuit may further employ the interpretation data (or interpretation information) to skip a need for refreshing the one or more particular addresses pointing to the memory components in the cache that no longer need refreshing.

The above referenced summary section is provided to introduce a selection of concepts in a simplified form that are further described above in the detailed description section. The summary is not intended to identify key features or essential features of the claimed subject matter, nor is it intended to be used to limit the scope of the claimed subject matter. Moreover, the claimed subject matter is not limited to implementations that solve any or all disadvantages noted in any part of this disclosure.

It should be intended that the subject matter of the claims not be limited to the implementations and illustrations provided herein, but include modified forms of those implementations including portions of implementations and combinations of elements of different implementations in accor-

What is claimed is:

1. An integrated circuit, comprising:
   a multi-level cache having multiple levels of memory components that store data with multiple addresses;
   a controller that provides directives to the multi-level cache; and
   a refresh circuit that:
      intercepts the directives provided from the controller before the multi-level cache receives the directives;
      interprets the directives to generate interpretation information based on determining one or more particular addresses of the multiple addresses pointing to at least one level of the memory components in the multi-level cache that no longer need refreshing, and
      employs the interpretation information to conserve energy by selectively cutting power to the one or more particular addresses pointing to the at least one level of the memory components in the multi-level cache that no longer need refreshing.

2. The integrated circuit of claim 1, wherein the at least one level of the multi-level cache comprises a dynamic random access memory (DRAM) array, and wherein the memory components comprise DRAM components that are arranged in a structural form to define the DRAM array.

3. The integrated circuit of claim 1, wherein:
   the controller refers to a first controller,
   the integrated circuit comprises a second controller that receives commands or instructions from off-chip memory,
   the directives from the first controller comprise a cache invalidation command or instruction, and
   the commands or instructions from the off-chip memory comprise a memory invalidation command or instruction.

4. The integrated circuit of claim 1, wherein the commands or instructions comprise a memory unmap command or instruction that is associated with a deallocation operation or a trim operation.

5. The integrated circuit of claim 3, wherein the first controller and the second controller comprise a processor, a central processing unit (CPU), a graphics processing unit (GPU), or a memory controller, and wherein the first controller is different from the second controller.

6. The integrated circuit of claim 1, wherein the refresh circuit conserves energy by employing the interpretation information to skip refresh operations associated with the need for refreshing the one or more particular addresses pointing to the memory components in the multi-level cache that no longer need refreshing.

7. The integrated circuit of claim 1, further comprising a bit vector circuit that interfaces with the refresh circuit and assists with determining the one or more particular addresses of the multiple addresses that no longer need refreshing.

8. The integrated circuit of claim 1, wherein determining the one or more particular addresses that no longer need refreshing refers to determining one or more instances where retaining data is deemed unnecessary.

9. The integrated circuit of claim 1, wherein the refresh circuit monitors and tracks the directives received from the first and second controllers to assist with determining the one or more particular addresses of the multiple addresses that no longer need refreshing.

10. The integrated circuit of claim 1, wherein employing the interpretation information to skip the need for refreshing the one or more particular addresses comprises utilizing the interpretation information to save power by escaping the need for refreshing the one or more particular addresses.

11. The integrated circuit of claim 1, wherein the multi-level cache comprises a plurality of cache lines, and wherein the refresh circuit is configured to check a bit vector of a respective cache line to determine whether to skip refreshing the respective cache line.

12. An integrated circuit, comprising:
a multi-level cache having at least one level of dynamic random access memory (DRAM) components that store data with multiple addresses;
a processor that communicates with the multi-level cache to send directives to the multi-level cache; and
a self refresh circuit that:
intercepts the directives from the processor before the multi-level cache receives the directives;
determines one or more particular addresses of the multiple addresses that reference cache instances in the at least one level of the multi-level cache where retaining data is deemed unnecessary;
interprets the intercepted directives to generate interpretation data based on determining the one or more particular addresses of the multiple addresses that reference the cache instances in the at least one level of the multi-level cache where retaining data is deemed unnecessary; and
uses the interpretation data to save energy by selectively cutting a supply of power to the one or more particular addresses of the multiple addresses that point to the at least one level of DRAM components in the multi-level cache that no longer need to retain data.

13. The integrated circuit of claim 12, wherein the DRAM components are arranged in a structural form to define a DRAM array.

14. The integrated circuit of claim 12, wherein:
the directives comprise a cache invalidation command or instruction that is used as a memory unmap command or instruction that is related to a deallocation operation or a trim operation.

15. The integrated circuit of claim 12, wherein;
the processor comprises a central processing unit (CPU), a graphics processing unit (GPU), or a memory controller,
the integrated circuit further comprises a controller that receives commands or instructions from off-chip memory, and
the processor is different from the controller.

16. The integrated circuit of claim 12, further comprising a bit vector circuit that interfaces with the self refresh circuit and assists with determining the one or more particular addresses of the multiple addresses that reference the cache instances where retaining data is deemed unnecessary.

17. The integrated circuit of claim 12, wherein the self refresh circuit monitors and tracks the directives intercepted from the processor to assist with determining the one or more particular addresses of the multiple addresses that reference the cache instances where retaining data is deemed unnecessary.

18. The integrated circuit of claim 12, wherein using the interpretation data to save power by escaping a need for retaining data for the one or more particular addresses comprises employing the interpretation data to conserve energy by skipping the need for refreshing the one or more particular addresses.

19. A method for manufacturing an integrated circuit, comprising:
fabricating a multi-level cache having multiple levels of memory components that store data with addresses;
fabricating a controller that provides directives to the multi-level cache; and
fabricating a refresh circuit that is configured to:
intercept the directives provided by the controller before the multi-level cache receives the directives;
interpret the directives to generate interpretation data based on determining one or more particular addresses of the addresses that reference cache instances in at least one level of the multiple levels where retaining data is deemed unnecessary, and
employ the interpretation data to selectively cut a supply of power to the one or more particular addresses pointing to the memory components in the at least one level of the multi-level cache that no longer need refreshing.

* * * * *